US006359375B1

(12) United States Patent
Guo et al.

(10) Patent No.: US 6,359,375 B1
(45) Date of Patent: Mar. 19, 2002

(54) METHOD TO BUILD A HIGH BANDWIDTH, LOW CROSSTALK, LOW EM NOISE TRANSDUCER

(75) Inventors: Xiaocong Guo, Woodinville; Thomas G. Houck, Issaquah, both of WA (US)

(73) Assignee: Siemens Medical Solutions USA, Inc., Iselin, NJ (US)

( * ) Notice: Subject to any disclaimer, the term of this patent is extended or adjusted under 35 U.S.C. 154(b) by 0 days.

(21) Appl. No.: 09/306,648

(22) Filed: May 6, 1999

Related U.S. Application Data

(60) Provisional application No. 60/084,506, filed on May 6, 1998.

(51) Int. Cl.[7] .............................................. H01L 41/08

(52) U.S. Cl. ...................................................... 310/334

(58) Field of Search ................................ 310/334–336; 600/437, 459; 128/903

(56) References Cited

U.S. PATENT DOCUMENTS

| | | | | | |
|---|---|---|---|---|---|
| 4,217,684 | A | * | 8/1980 | Brisken et al. | 310/334 X |
| 4,672,591 | A | * | 6/1987 | Breimesser et al. | 310/334 X |
| 4,676,106 | A | * | 6/1987 | Nagai et al. | 310/334 X |
| 5,329,496 | A | | 7/1994 | Smith | 367/140 |
| 5,381,385 | A | | 1/1995 | Greenstein | 367/140 |
| 5,420,429 | A | | 5/1995 | Eberhard et al. | 250/367 |
| 5,438,554 | A | * | 8/1995 | Seyed-Bolorforosh et al. | 310/334 X |
| 5,497,540 | A | | 3/1996 | Venkataramani et al. | 29/25.35 |
| 5,548,564 | A | | 8/1996 | Smith | 367/140 |
| 5,640,370 | A | | 6/1997 | Hanafy et al. | 367/140 |
| 5,655,538 | A | | 8/1997 | Lorraine et al. | 128/662.03 |
| 5,704,105 | A | | 1/1998 | Venkataramani et al. | 29/25.35 |
| 5,744,898 | A | | 4/1998 | Smith et al. | 310/334 |
| 5,886,454 | A | * | 3/1999 | Ito et al. | 310/334 X |
| 5,906,580 | A | * | 5/1999 | Kline-Schoder et al. | 310/334 X |
| 5,920,523 | A | * | 7/1999 | Hanafy et al. | 310/334 X |

* cited by examiner

*Primary Examiner*—Mark O. Budd

(57) ABSTRACT

An ultrasound transducer array (250) in which the piezoelectric layer (256) and the matching layer(s) (258) have different sub-dicing. In one embodiment, the piezoelectric layer (256) is diced only once and the matching layer(s) (258) is diced more than once. A resulting transducer shows improved bandwidth, crosstalk and noise performance.

8 Claims, 12 Drawing Sheets

Acceptance Angle of 3.5PL28+, #exp, Elem#: 64. (Tx = 1, G = 20, D = 50, PRR = 1K)

Acceptance Angle of 3.5PL28+, #exp, Elem#: 64. (Tx = 1, G = 20, D = 50, PRR = 1K)

Acceptance Angle of 3PL28+, #061, Elem#: 64.
(E = 1, D = 50, G = 40 – 20, F:it = 0, PRF = 1K)

Acceptance Angle of 5Acuson V4, #44803390, Ele#:064,
(E = 1, D = 50, G = 40 - 20, Filt = 0, PRF = 1K)

Acceptance Angle of 5Acuson V4, #44803390, Ele#:064,
(E = 1, D = 50, G = 40 – 20, Filt = 0, PRF = 1K)

METHOD TO BUILD A HIGH BANDWIDTH, LOW CROSSTALK, LOW EM NOISE TRANSDUCER

CROSS REFERENCE TO RELATED APPLICATIONS

This application claims priority of Provisional Patent Application Ser. No. 60/084,506, entitled "A Method to Build High Bandwidth, Low Crosstalk, Low EM Noise Transducer," filed May 6, 1998.

BACKGROUND OF THE INVENTION

1. Field of the Invention

The present invention relates to transducers, and particularly, to improved ultrasound transducer arrays.

2. Description of the Related Art

Ultrasound machines are used to non-invasively obtain image information about the structure of an object which is hidden from view and has become widely known as a medical diagnostic tool. As shown in FIG. 1, medical ultrasonic transducer arrays conventionally are fabricated from a block of ceramic piezoelectric material within which individual elements are defined and isolated from each other by sawing at least partially through the block of piezoelectric material making a number of cuts with a dicing saw. In particular, as shown in FIG. 1 a transducer array 100 includes a layer 104 of transducer elements 104*a*–104*f*. The transducer elements 104*a*–104*f* are laid down on a backing medium 102. The backing medium 102 serves to support the transducer structure. One or more acoustical matching layers 106 (including elements 106*a*–106*f*) and 107 (including elements 107*a*–107*f*) may be laid down on top of the transducer layer 104. The piezoelectric layer 104 may be formed of any piezoelectric ceramic material such as lead zirconate titanate (PZT). The matching layers 106, 107 and the transducer layer 104 may be glued to one another using an epoxy, such as Der332. The layers are then diced by forming kerfs 110*a*–110*e* with a standard dicing machine. Typically the kerfs 110*a*–110*e* are made both in the direction parallel to the paper and perpendicular to the paper.

Typically, the ratio of the width to the thickness of the piezoelectric elements 104*a*–104*f* is optimized to about 0.5. The ratio of the width to thickness of the matching layers is typically ignored. As is generally known, the basic requirement for the transducers is high bandwidth, low pulse length, low crosstalk to the neighboring elements. However, if the width and thickness ratio of the matching layer is close to 1, lateral and thickness vibration mode will have a much stronger coupling, which in turn, will provide higher crosstalk, and unpredictable spectrum and pulse, which can degrade image quality.

Conventionally, the elements are sub-diced in order to change the width and thickness ratio of the ceramic piezoelectric material. For example, for the Siemens 5L40 transducer, the element is sub-diced once so that each sub-element width is around 116 micrometers and the thickness of the PZT element is about 256 micrometers. The resulting ratio of about 0.46 for the piezo-active layer results in a very good value for $K_T$ (electromechanical coupling coefficient) and low coupling. However, for the matching layer the thickness is typically about 130 micrometers resulting in a ratio of about 0.91, leading to a relatively strong coupling between the thickness mode and the unwanted lateral mode.

SUMMARY OF THE INVENTION

These drawbacks of the prior art are overcome in large part by an ultrasound transducer array according to the present invention. According to one embodiment of the invention, the piezoelectric elements and the matching layer (s) are diced with different sub-dicing. In particular, according to one embodiment the PZT is sub-diced once but at the same time the first matching layer is sub-diced twice to obtain a more optimum ratio for the matching layer.

BRIEF DESCRIPTION OF THE DRAWINGS

A better understanding of the present invention is obtained when the following detailed description is considered in conjunction with the following drawings in which.

DETAILED DESCRIPTION OF THE INVENTION

Figure 1:
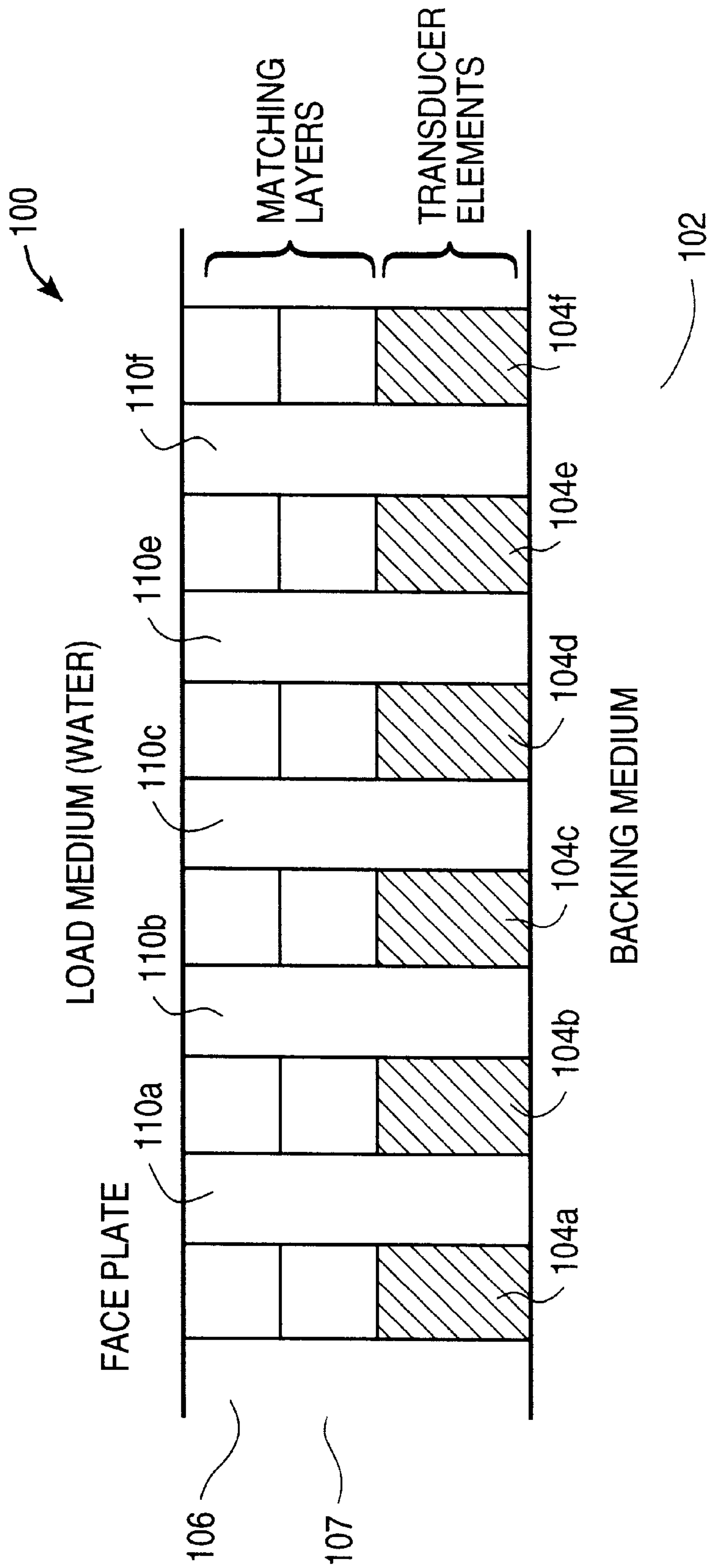
FIG. 1 is a diagram of an exemplary ultrasound transducer array according to the prior art.
Figure 2:
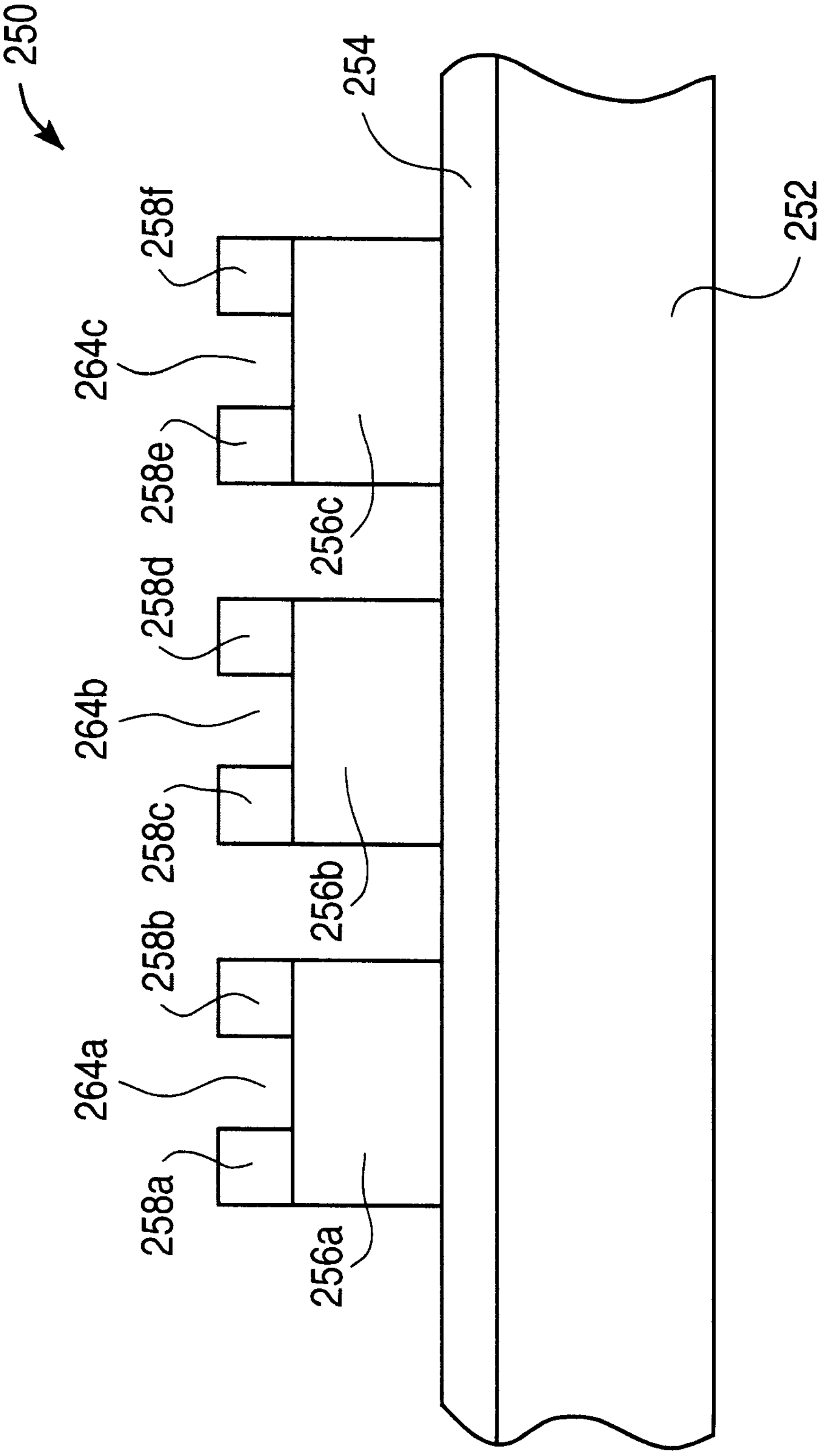
FIG. 2 is a diagram of an exemplary ultrasound transducer array according to an embodiment of the invention.

Referring now to FIG. 2, a diagram illustrating a transducer array 250 in accordance with an embodiment of the present invention is shown. In particular, the array includes an interconnecting circuit or flexible circuit 254 disposed upon a support structure or backing block 252. As is known, the flexible circuit 254 serves to provide the respective signal electrodes and corresponding traces or leads. The flexible circuit 254 generally has a plurality of adjacent traces or leads (not shown) extending from opposite sides of the block. The flexible circuit 254 may be made of a copper layer bonded to a polyimid material, typically a KAPTON-Flexible circuit, manufactured by Sheldahl of Northfield, Minn. The material forming the backing block 252 may be acoustically matched to the flexible circuit 254. Further, the acoustic impedance of the flexible circuit 254 is approximately equal to that of the epoxy material for gluing the flexible circuit to the backing block.

A plurality of piezoelectric elements 256*a*–256*c* are disposed upon the flexible circuit 254. Kerfs 260, 262 separate the piezoelectric elements 256*a*–256*c*. According to an embodiment of the present invention, a matching layer of elements 258*a*–258*f* is provided on top of the piezoelectric elements 256*a*–256*c*. As shown, the matching layer elements 258*a*–258*f* are diced smaller than the underlying piezoelectric elements 256*a*–256*c*. Thus, additional kerfs 264*a*–*c* separate the elements 258*a*, 258*b*, the elements 258*c*, 258*d* and the elements 258*e*, 258*f*, respectively.

Figure 3A:
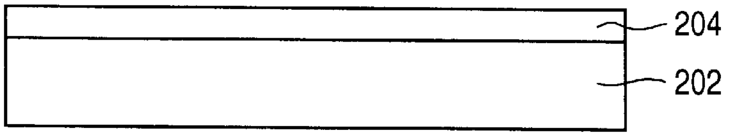
FIGS. 3A–3E illustrate formation of an ultrasound transducer array according to an embodiment of the invention.
Figure 3B:
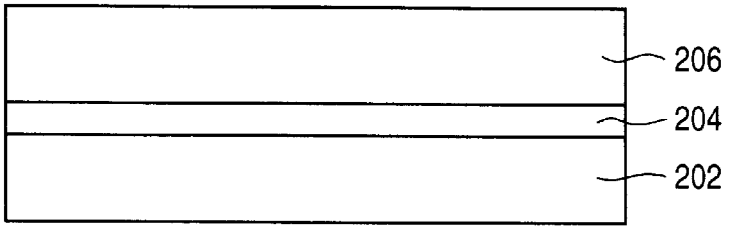

FIG. 3A–FIG. 3E illustrate a method for producing an ultrasound transducer array according to an embodiment of the present invention. In particular, as shown in FIG. 3A, an interconnecting circuit or flexible circuit 204 is provided on a support structure or backing block 202. As shown in FIG. 3B, a piezoelectric layer 206 is disposed on the flexible circuit 204. The backing block 202, the flexible circuit 204 and the piezoelectric layer 206 may be glued to one another by use of a known epoxy adhesive. The epoxy adhesive is placed between the backing block between the flexible circuit and the piezoelectric layer. The layers are secured to one another by affixing all layers together and applying pressure to the layers.

Figure 3C:
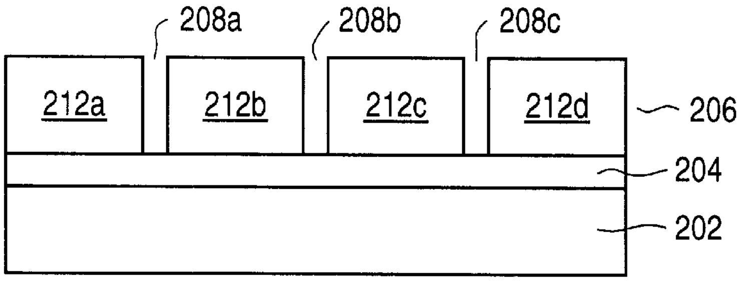

As shown in FIG. 3C, the piezoelectric layer 206 is diced by forming kerfs 208*a*–208*c* therein with a standard dicing machine. As a result of the dicing operation, a plurality of transducer elements 212*a*14 212*d* are formed.

Figure 3D:
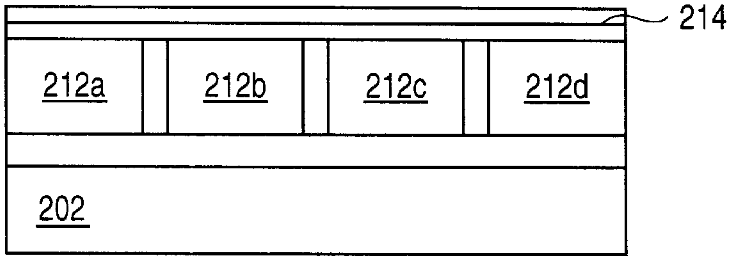
Figure 3E:
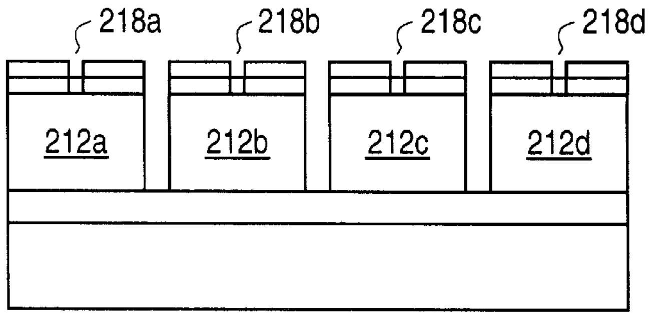

Next, as shown in FIG. 3D, one or more matching layers 214 may be laminated in a known manner on top of the diced piezoelectric layer 206. Finally, as shown in FIG. 3E, the matching layer or layers 214 are diced by introducing kerfs 218*a*–218*d*. Further, cuts coincident with kerfs 208*a*–208*c* may be introduced.

Figure 4A:
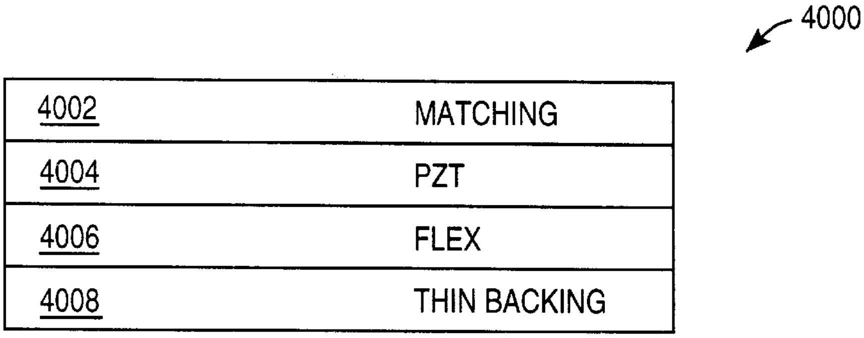
FIGS. 4A–4D illustrate formation of an ultrasound transducer array according to another embodiment of the invention.

An alternate method for producing a low crosstalk, low EM noise ultrasound transducer, according to the present invention, is shown in FIGS. 4A–4D. A substrate 4000 as shown in FIG. 4A includes a thin matching layer 4002 bonded to a PZT layer 4004, a flexible circuit layer 4006 and a thin backing layer 4008. The thin backing layer 4008 may be about 0.15 mm.

Figure 4B:
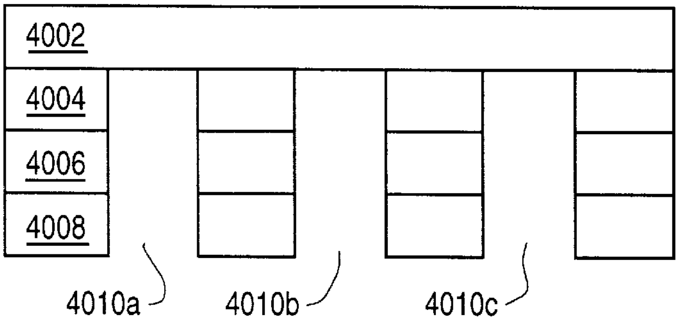
Figure 4C:
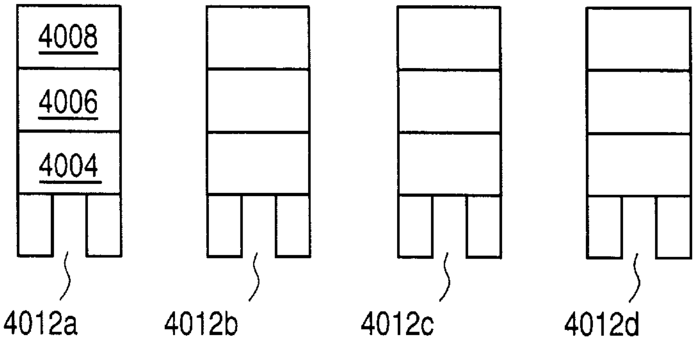
Figure 4D:
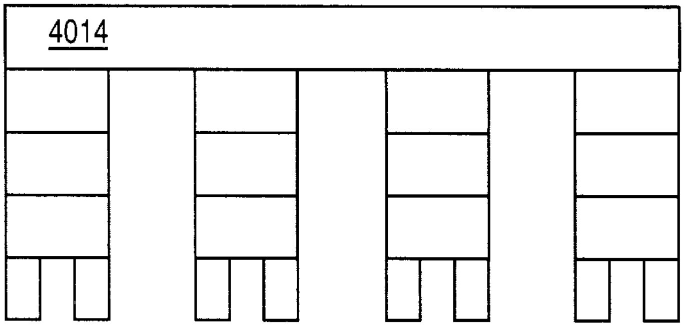

In FIG. 4B, a series of kerfs 4010*a*, 4010*b*, and 4010*c* are cut into the substrate from the thin backing layer 4008 side. The kerfs 4010*a*–4010*c* are extended to the top of the PZT layer 4004. In the next step, as illustrated in FIG. 4C, the array substrate may be flipped over to expose the front surface for the matching sub-dicing cut. That is, the matching layer 4002 may be sub-diced to result in kerfs 4012*a*, 4012*b*, 4012*c* and 4012*d*. As will be discussed in greater detail below, standard kerf filling material (not shown) or other known methods may be employed to hold the elements together during this process. In addition, cuts coincident with kerfs 4010*a*–4010*c* may be made. Finally, as shown in FIG. 4D, a thick backing layer 4014 is applied to the thin backing layer 4008.

As noted above, kerf filling may be desirable between the dicing steps described above with regard to FIG. 4. In particular, the standard DC734RTV filling material could be used for kerf filling as well as to line the thick backing 4014. Alternatively, a thin (3 micron) barrier material may be used between the DC734RTV and epoxy used to bond the thick backing. If air kerfs are desired, they may be obtained by bonding the barrier material with thin sheets to the diced surfaces and a thick backing bonded to the barrier material. Alternatively, the thick backing 4014 may be bonded to the thin backing using a thin adhesive. Furthermore, if the PZT layer or the first conductive matching layer were not diced completely through, a fully covered grounded plane for the array which would reduce the EM noise level compared to a conventional transducer array would result.

Figure 5:
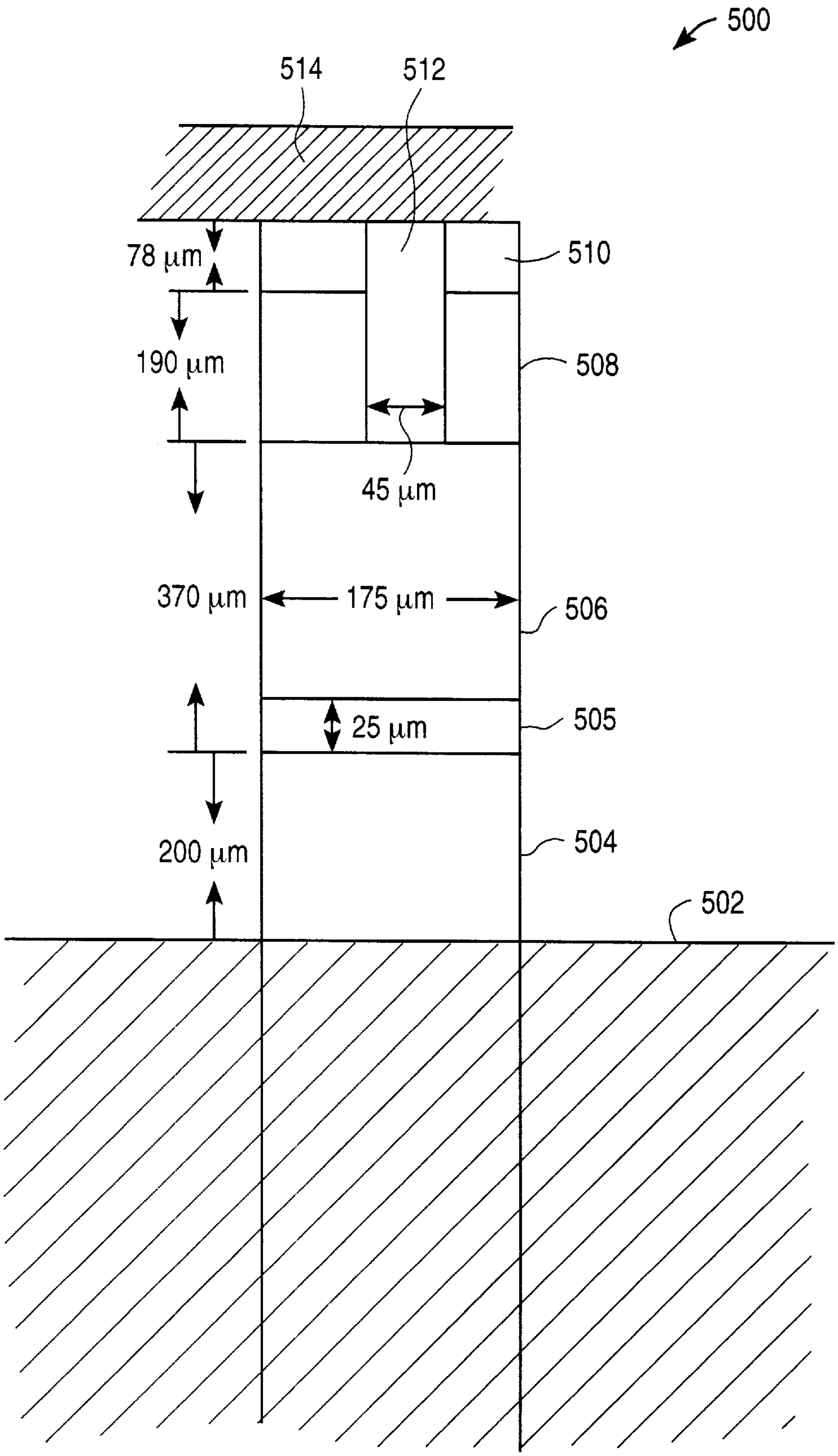
FIG. 5 illustrates an exemplary ultrasound transducer element according to an embodiment of the invention.

A closeup of an exemplary element of a transducer array, in accordance with the present invention, is shown in FIG. 5. In particular, the element 500 includes a backing material 502 which is cut for a 200 μm backing layer portion 504. A 25 μm flexible circuit 505 is then provided. A PZT layer 506, about 175 μm wide and 370 μm thick, is then added. Next are first and second matching layers 508, 510, respectively. According to one embodiment, the first matching layer 508 is about 190 μm thick, and the second matching layer is about 78 μm thick. A kerf 512 separates the matching layer elements. Finally, an ultrasound transducer lens 514 is applied to the top of all of the elements in the array.

The efficacy of the use of matching layers having different sub-dicing than the PZT layer has been experimentally demonstrated. In particular, a transducer array according to the present invention (e.g., as shown in FIG. 5) was tested for "acceptance angle" in comparison with the Siemens 3.5 MHz phase array and another manufacturer's 3.5 MHz phase array. The acceptance angle is the −6 dB relative amplitude frequency for a two-way pin target angularly displaced from the transducer.

Figure 6A:
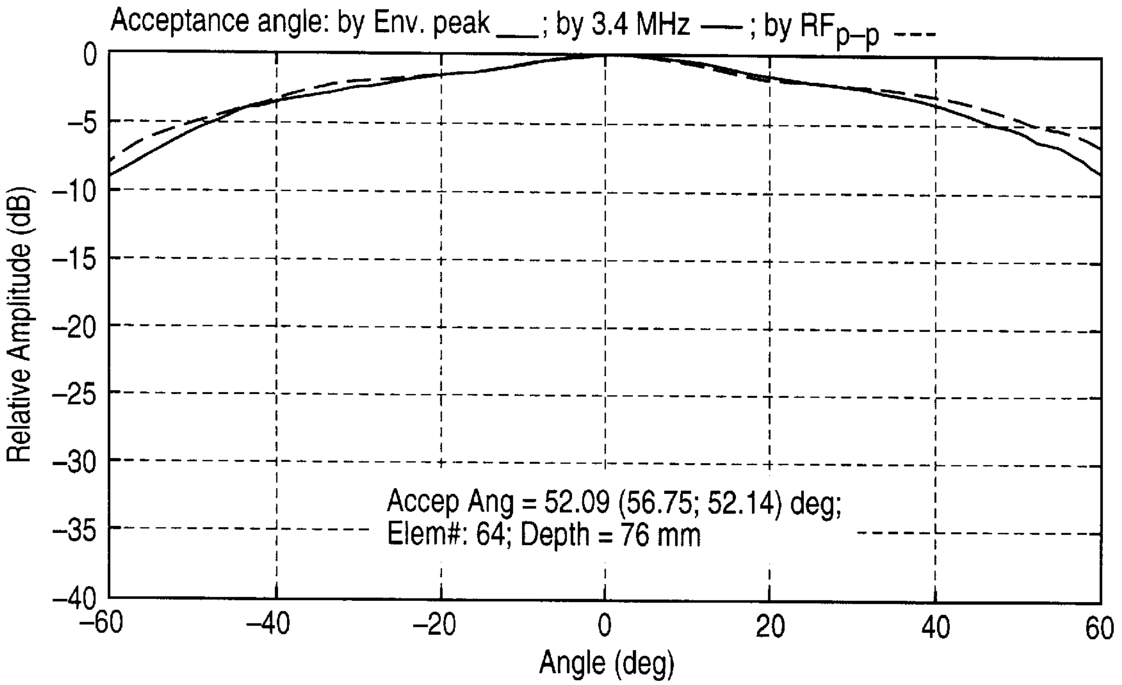
FIGS. 6A–6D, 7A–7D, 8A–8D and 9A–9D illustrate test results comparing performance of an exemplary ultrasound transducer array according to an embodiment of the invention with prior transducer arrays.
Figure 8A:
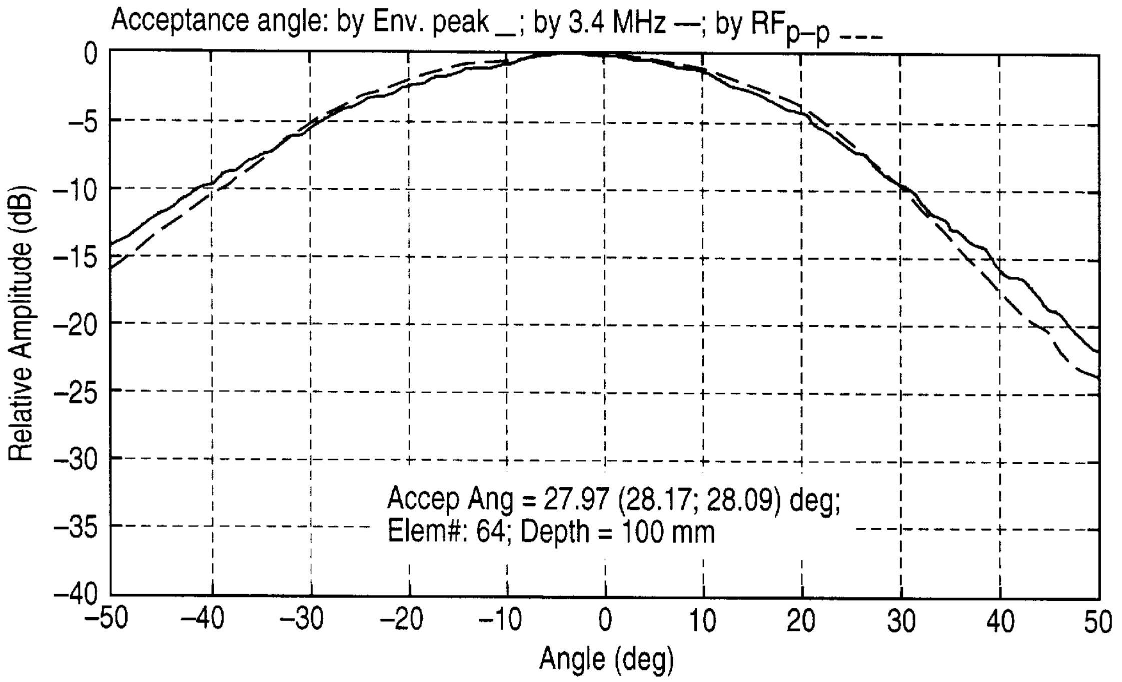
Figure 9A:
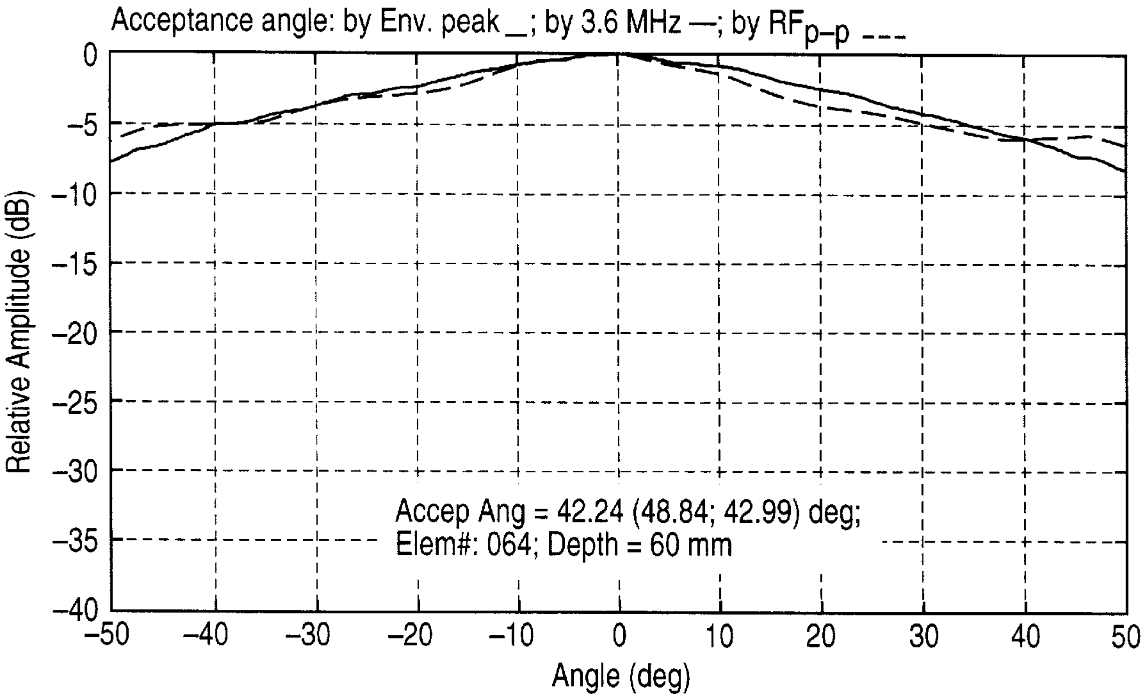

FIGS. 6A–6D illustrate the results for the test low crosstalk transducer. In particular, FIG. 6A illustrates the detected amplitude as a function of frequency. As can be seen, the angle at which the relative amplitude is −6 dB is 52°. A similar diagram (FIG. 8A) is shown for the non-modified case. As shown, the acceptance angle there is ~28°. Finally, the result for the other manufacturer's array is shown in FIG. 9A. There, the −6 dB acceptance angle is 48.84°.

Figure 6B:
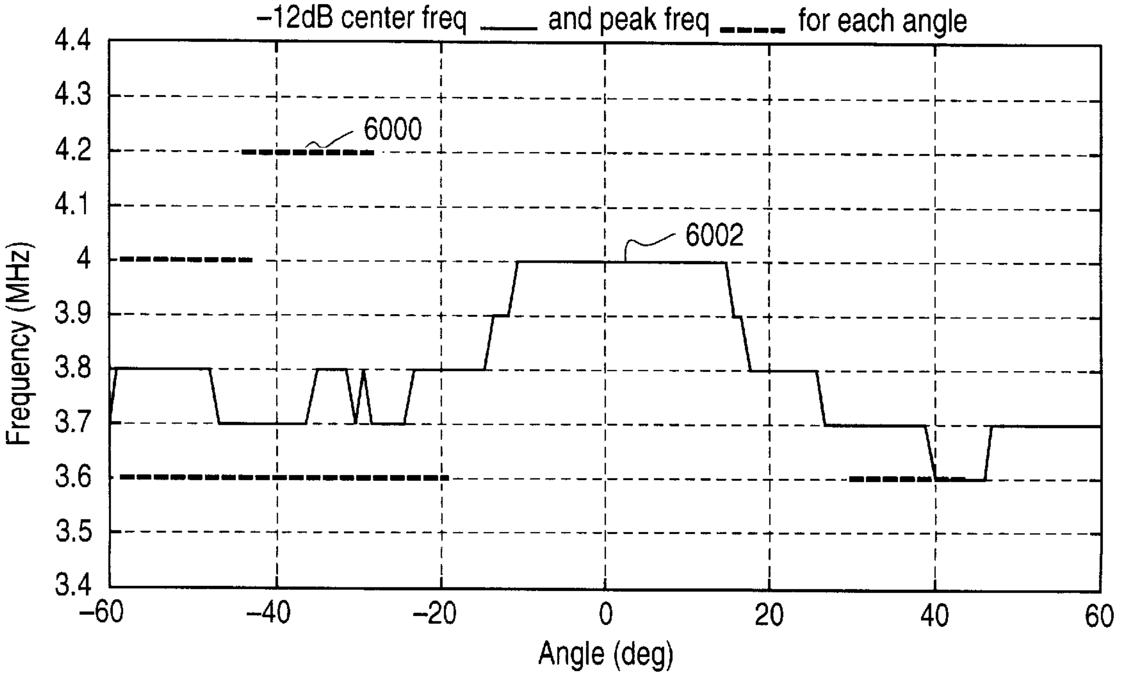
Figure 6C:
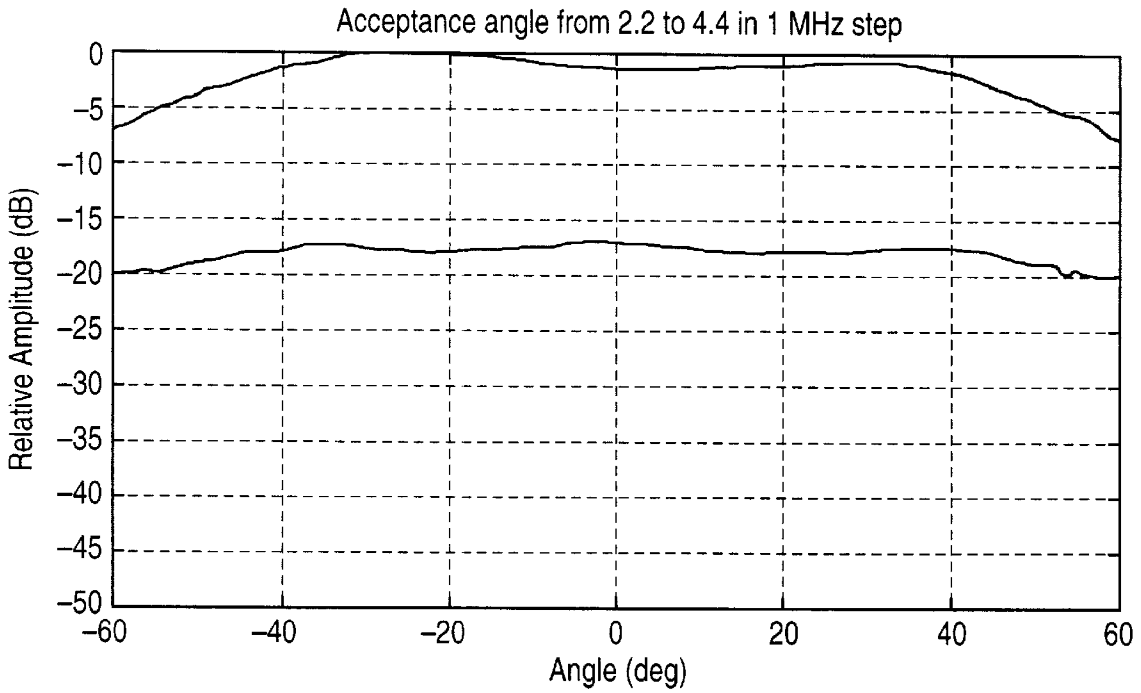
Figure 6D:
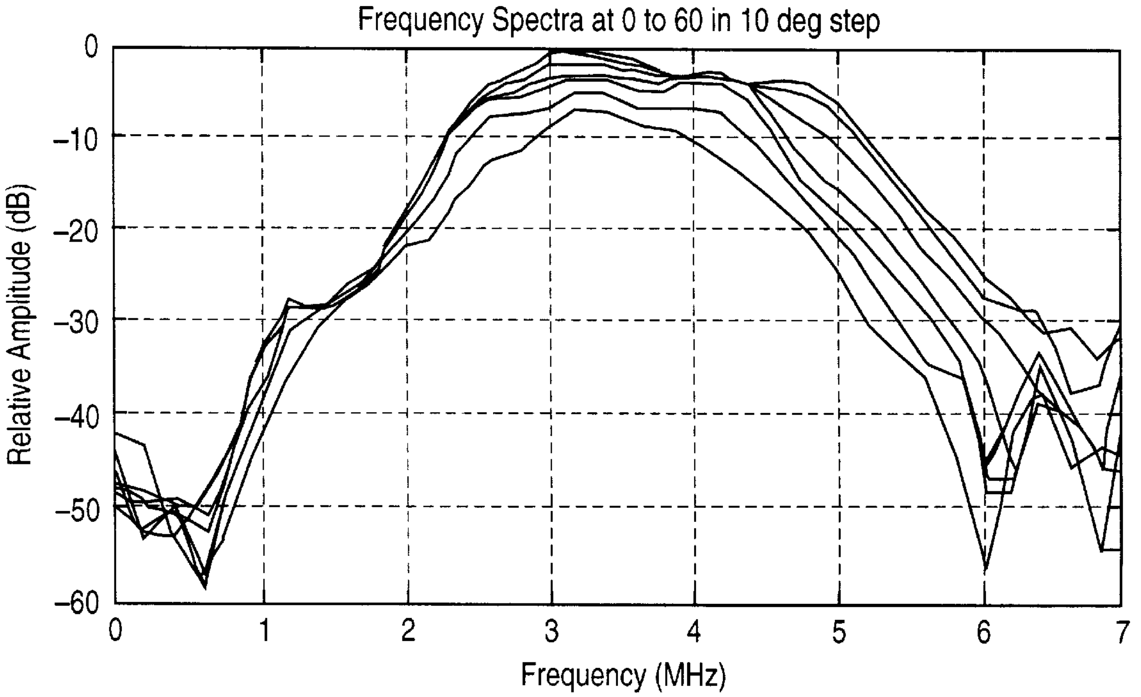
Figure 8B:
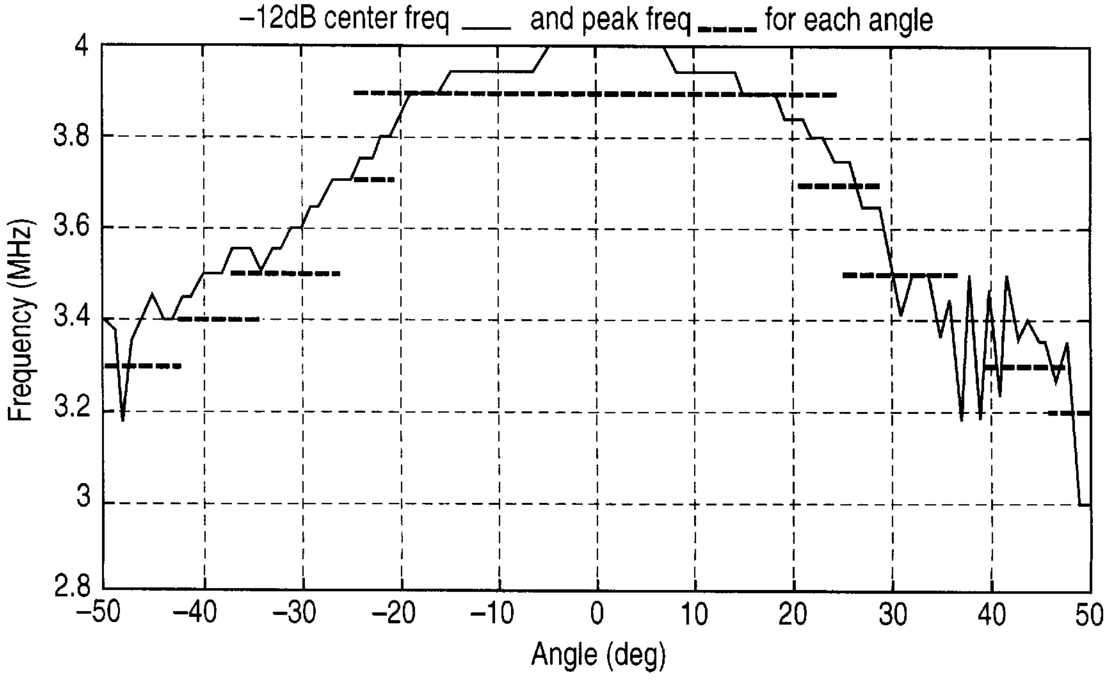
Figure 8C:
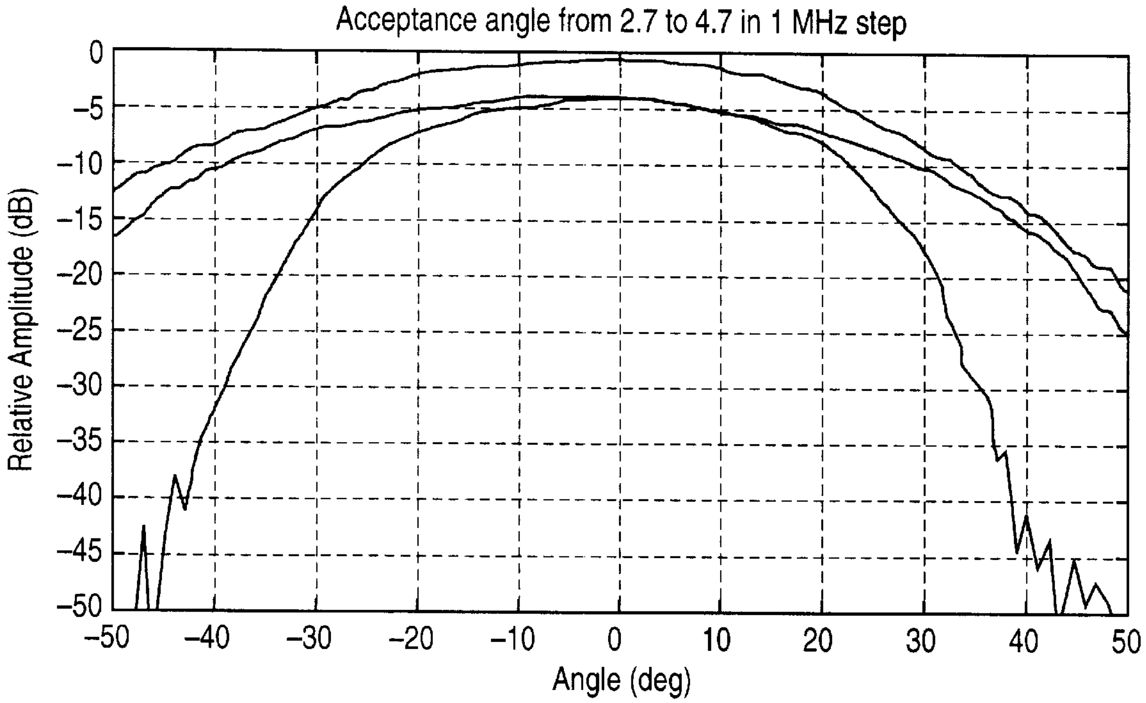
Figure 8D:
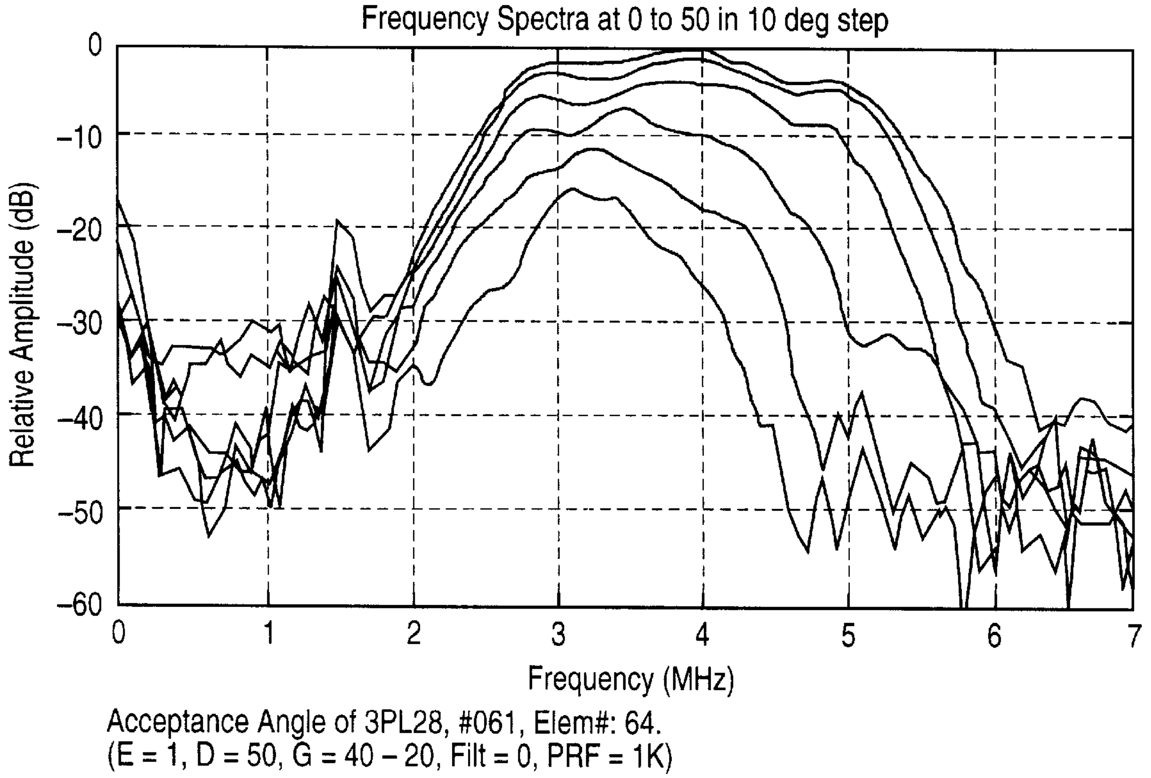
Figure 9B:
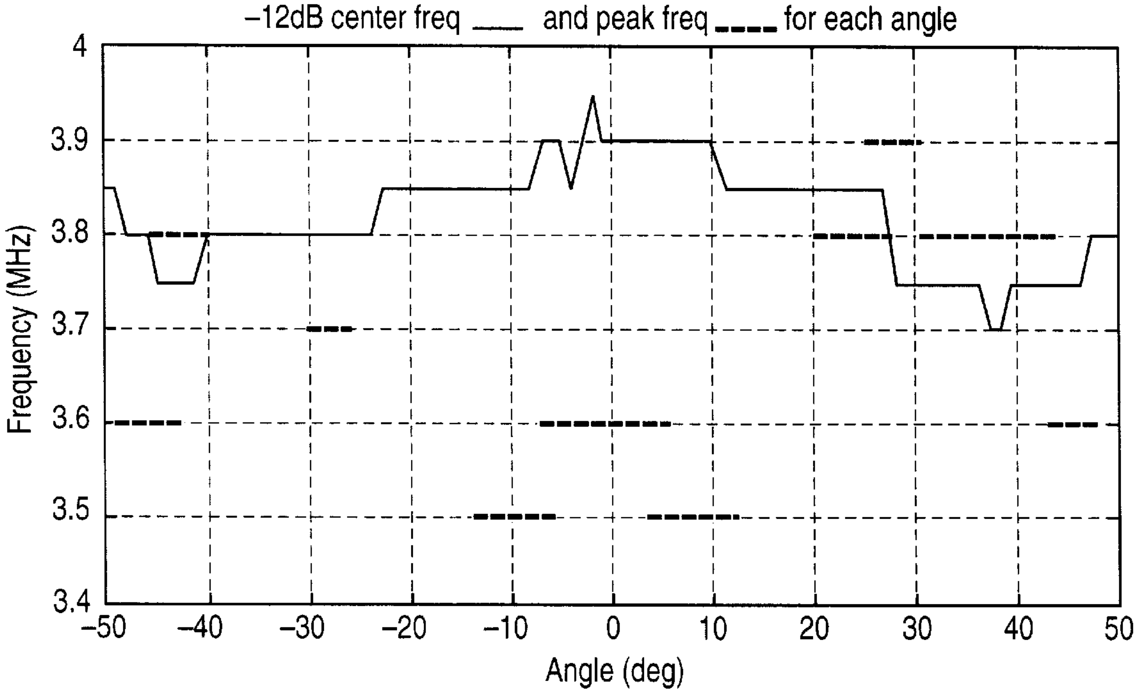
Figure 9C:
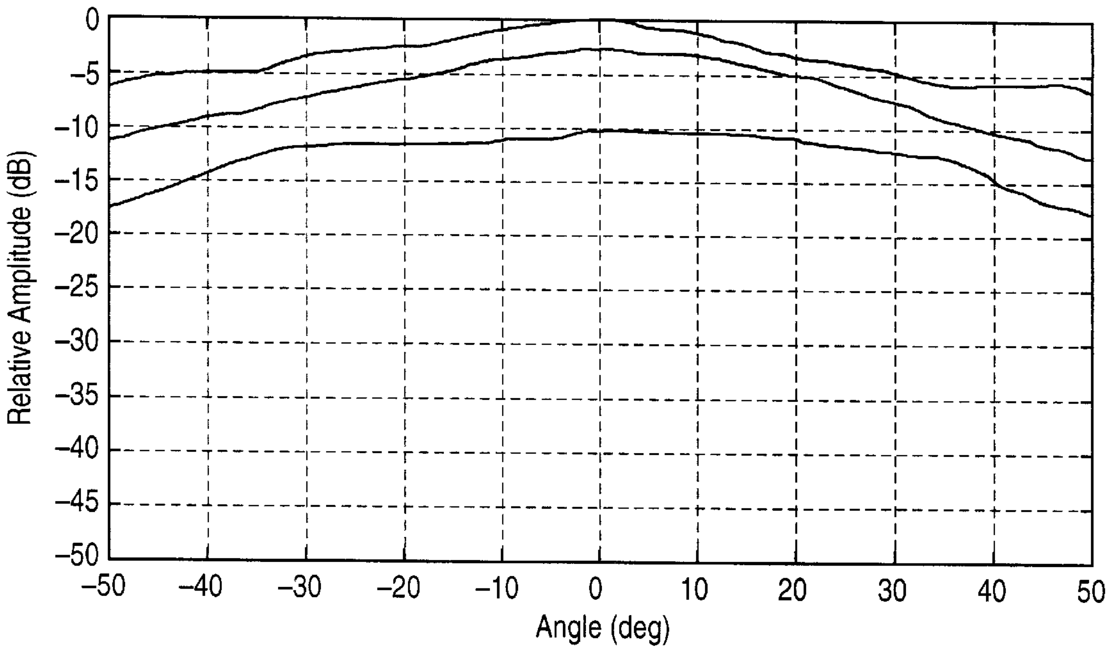
Figure 9D:
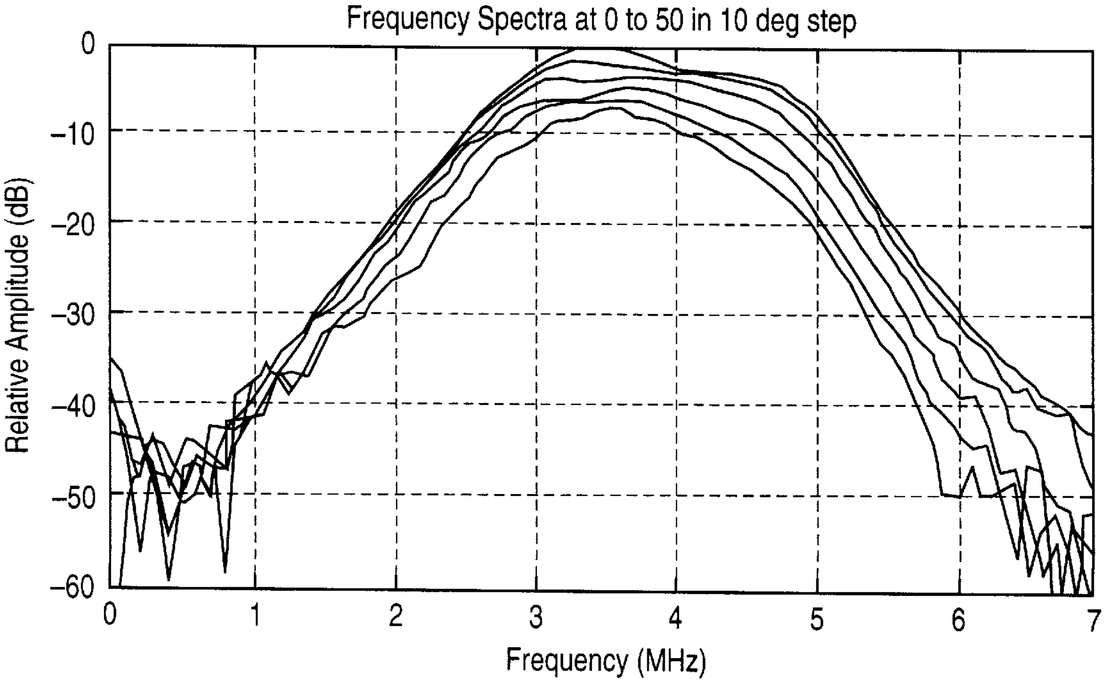

FIGS. 6B, 8B and 9B illustrate the −12 dB and peak frequency curves for each angle for each of the tested transducers. FIGS. 6C, 8C and 9D illustrate the acceptance angle for several frequencies in 1 MHz steps. FIGS. 6D, 8D and 9D illustrate the frequency spectra from 0–60 in 10 degree steps. As can be seen, the spectrum for the test device remains the same over a range of frequencies.

The results are summarized in Table 1, below:

TABLE 1

| | ACCEPTANCE ANGLE | | | |
|---|---|---|---|---|
| TYPE | ACCEPT ANGLE | −12 dB Center Frequency at 0° (MHz) | −12 dB Center Frequency at 20° (MHz) | −12 dB Center Frequency at 40° (MHz) |
| Low crosstalk #1 | 52.09 | 4.0 | 3.8 | 3.7 |
| Standard 3.5 MHz array | 27.97 | 4.0 | 3.8 | 3.5 |
| Other manuf. Array | 44.24 | 3.9 | 3.85 | 3.75 |

Figures 7A, 7B, 7C, 7D:
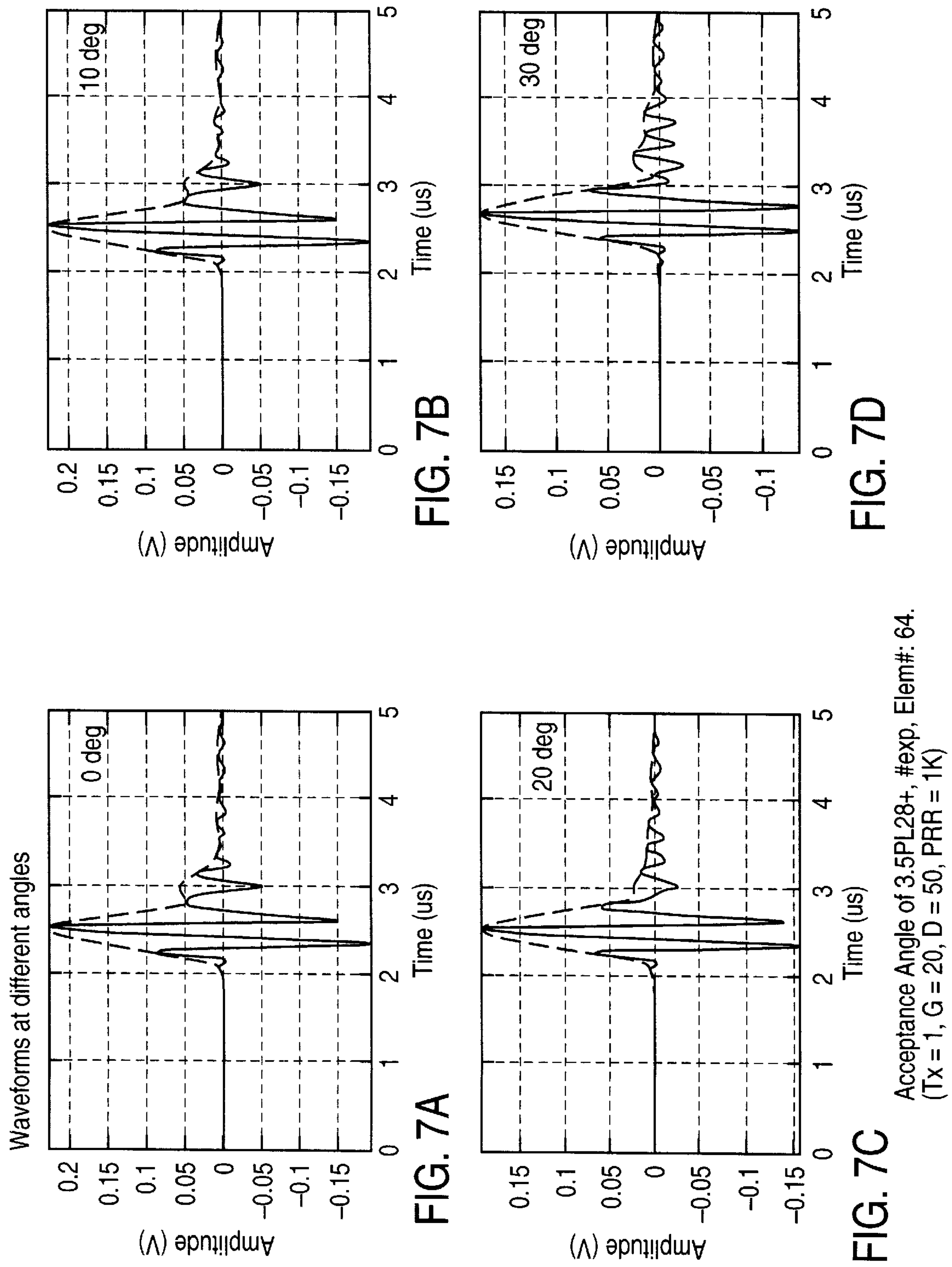

Finally, FIG. 7 illustrates the waveforms at various angles for the test element. Thus, FIG. 7A illustrates the pulse at 0°; FIG. 7B illustrates the pulse at 10°; FIG. 7C illustrates the pulse at 20°; and FIG. 7D illustrates the pulse at 30°. As can be seen, the pulse remains substantially the same over the entire range of frequencies.

What is claimed is:

1. An ultrasound transducer array comprising:

a piezoelectric layer having a first sub-dicing, said first sub-dicing comprising first predetermined kerfs separating piezoelectric elements; and at least one matching layer having an additional second sub-dicing different from said first sub-dicing, said second sub-dicing comprising second predetermined kerfs interposed between and substantially parallel to said first predetermined kerfs wherein said first predetermined kerfs extend through said piezoelectric layer and said matching layer and said second predetermined kerfs extend through said matching layer, such that said first predetermined kerfs define piezoelectric elements having a first width and said first and second predetermined kerfs define matching elements having a second width different from said first width.

2. An ultrasound transducer array according to claim 1, wherein said first kerfs and said second kerfs are of different widths.

3. An ultrasound transducer array according to claim 1, wherein said second sub-dicing is smaller than said first sub-dicing.

4. An ultrasound transducer array comprising:

a piezoelectric layer including a plurality of piezoelectric elements separated by first kerfs;

at least one layer of matching elements;

a first predetermined number of said matching elements separated from one another by said first kerfs; and a second predetermined number of said matching elements separated from one another by second, additional kerfs.

5. An ultrasound transducer array according to claim 4, wherein said first kerfs and said second kerfs are of different widths.

6. An ultrasound transducer array comprising:

a piezoelectric layer having a first sub-dicing, said first sub-dicing comprising first predetermined kerfs separating piezoelectric elements; and at least one matching layer having a second sub-dicing different from said first sub-dicing, said second sub-dicing comprising second predetermined kerfs interposed between said first predetermined kerfs, said second predetermined kerfs having a different depth than said first predetermined kerfs, non-coincident with and substantially parallel to said first predetermined kerfs such that said first predetermined kerfs define piezoelectric elements having a first width and said first and second predetermined kerfs define matching elements having a second width different from said first width.

7. An ultrasound transducer array in accordance with claim 6, wherein said second sub-dicing is smaller than said first sub-dicing.

8. An ultrasound transducer array comprising:

a plurality of piezoelectric elements separated by a plurality of first kerfs;

a plurality of matching elements on top of each of said plurality of piezoelectric elements, said plurality of matching elements being of smaller size than said piezoelectric elements;

wherein ones of said plurality of matching elements on top of a same piezoelectric element are separated from one another by second kerfs substantially parallel said first kerfs and are separated from ones of said plurality of matching elements on top of different piezoelectric elements by said first kerfs;

wherein said first kerfs extend through both a matching layer defining said matching elements and a piezoelectric layer defining said piezoelectric elements and said second kerfs extend only through said matching layer.

* * * * *